(12) United States Patent
Miyata et al.

(10) Patent No.: US 6,717,278 B2
(45) Date of Patent: Apr. 6, 2004

(54) SEMICONDUCTOR DEVICE HAVING A RESIST EDGE POSITIONED OVER THROUGHOLES

(75) Inventors: Osamu Miyata, Kyoto (JP); Ichirou Kishimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/096,188

(22) Filed: Mar. 12, 2002

(65) Prior Publication Data

US 2002/0125554 A1 Sep. 12, 2002

(30) Foreign Application Priority Data

Mar. 12, 2001 (JP) .......................................... 2001-68213

(51) Int. Cl.$^7$ .......................... H01L 23/48; H01L 23/52; H01L 29/40
(52) U.S. Cl. ........................ 257/783; 257/782; 257/700
(58) Field of Search ................................. 257/700, 782, 257/783

(56) References Cited

U.S. PATENT DOCUMENTS

| | | | | |
|---|---|---|---|---|
| 5,874,784 A | * | 2/1999 | Aoki et al. | .................. 257/787 |
| 5,953,592 A | * | 9/1999 | Taniguchi et al. | .......... 438/118 |
| 6,198,165 B1 | * | 3/2001 | Yamaji et al. | .............. 257/734 |

* cited by examiner

*Primary Examiner*—Phat X. Cao
(74) *Attorney, Agent, or Firm*—Gerald T. Rodner

(57) ABSTRACT

A semiconductor device includes a substrate, and the substrate is, on its surface, formed with wiring patterns onto which a resist is formed. Because an outer peripheral edge line of the resist passes over throughholes, the outer peripheral edge line of the resist never comes close to the wiring patterns and be in parallel thereto. Specifically, since the plurality of throughholes are arranged in a matrix fashion on the substrate, a direction to which each of the wiring patterns extends from each of the throughholes is sure to form a predetermined angle with respect to a direction that the throughholes are aligned. Accordingly, even if an outer periphery edge portion of the resist which passes over the throughholes flows into an outside thereof, a thin film of the resist is not formed in a long thin shape, and a plating film is not formed in a long thin shape on the thin film.

8 Claims, 7 Drawing Sheets

// SEMICONDUCTOR DEVICE HAVING A RESIST EDGE POSITIONED OVER THROUGHHOLES

BACKGROUND OF THE INVENTION

1. Field of the Invention

The present invention relates to a semiconductor device. More specifically, the present invention relates to a semiconductor device in which a resist is formed on wiring patterns on a substrate and, a semiconductor chip is die-bonded onto the resist.

2. Description of the Prior Art

In a conventional such a kind of semiconductor device 1 shown in FIG. 7(A), a resist 4 is formed on a substrate 3 provided with wiring patterns 2, and a semiconductor chip 6 is die-bonded onto the resist 4 via a die-bonding sheet 5. Furthermore, an upper surface electrode 6a of the semiconductor chip 6 and a bonding pad 2a of the wiring patterns 2 are wire-bonded with each other by a gold wire 7, and the semiconductor chip 6 and the gold wire 7 are encapsulated by a molding resin 8.

In such the semiconductor device 1, although the resist 4 is to fill a space between the substrate 3 and the die-bonding sheet 5, a formed position thereof was not especially taken into account.

In the prior art, since the formed position of the resist 4 was not especially taken into account, there was a case a visible outline of the resist 4 comes close to and arranged in parallel to the wiring patterns 2 as shown in an A portion in FIG. 7(B). Then, in this case, there was a fear that a flow-out of a periphery edge portion B of the resist 4 onto the wiring patterns 2 partly causes a plating defect and thus, a short-circuit of the wiring patterns 2.

More specifically, if the resist 4 flows onto the wiring patterns 2, a resist thin film 4a having a number of pinholes is formed in a long thin manner on the wiring patterns 2, and therefore, in a following plating processing, a portion of the wiring patterns 2 being exposed to the pinholes is also plated, and the plating becomes a long thin plating film on the surface of the resist thin film 4a. However, since the long thin plating film is connected to the wiring patterns 2 through the pinholes only, there was a fear that the long thin plating film is easily released due to a vibration, and therefore, there is a possibility that the wiring patterns 2 is short-circuited out by the released plating film.

SUMMARY OF THE INVENTION

Therefore, it is a primary object of the present invention to provide a semiconductor device capable of preventing a short-circuit of wiring patterns.

A semiconductor device according to the present invention comprises: a substrate formed with wiring patterns on its upper surface; a plurality of throughholes formed in a matrix fashion on the substrate; a resist formed on the upper surface of the substrate; a semiconductor chip die-bonded onto the resist; a mold which encapsulates the semiconductor chip; and an electrode connected to one ends of the wiring patterns through the throughholes from an lower surface of the substrate, wherein an outer peripheral edge line of the resist passes over the throughholes.

Since the plurality of throughholes are formed in a matrix fashion on the substrate, it is impossible to make a direction to which each of the wiring patterns extends from each of the throughholes coincident a direction that the throughholes are aligned due to an obstruction of adjacent throughholes. That is, the direction to which the wiring patterns extend from the throughholes is sure to form a predetermined angle with respect to the direction to which the throughholes are aligned. Accordingly, in the present invention in which the outer peripheral edge line of the resist passes over the throughholes, the outer peripheral edge line of the resist never comes close to and be in parallel to the wiring patterns, and there is no possibility that a plating film is formed in a long thin shape on the resist flowing-out onto the wiring patterns.

According to the present invention, it is possible to prevent a short-circuit of the wiring patterns due to an exfoliation of the plating film, and it is possible to drastically reduce a fraction defective.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
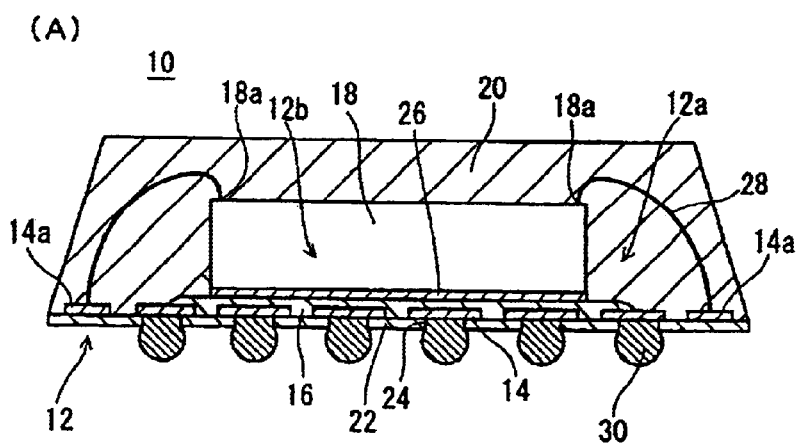
FIG. 1 is an illustrative view showing one embodiment of the present invention.
Figure 1:
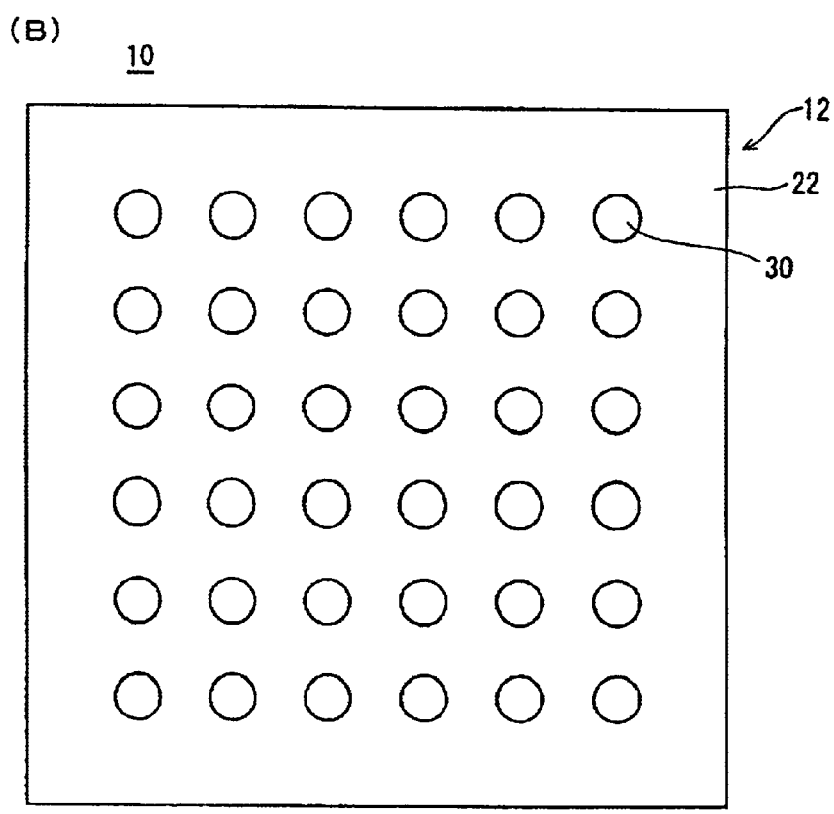
Figure 2:
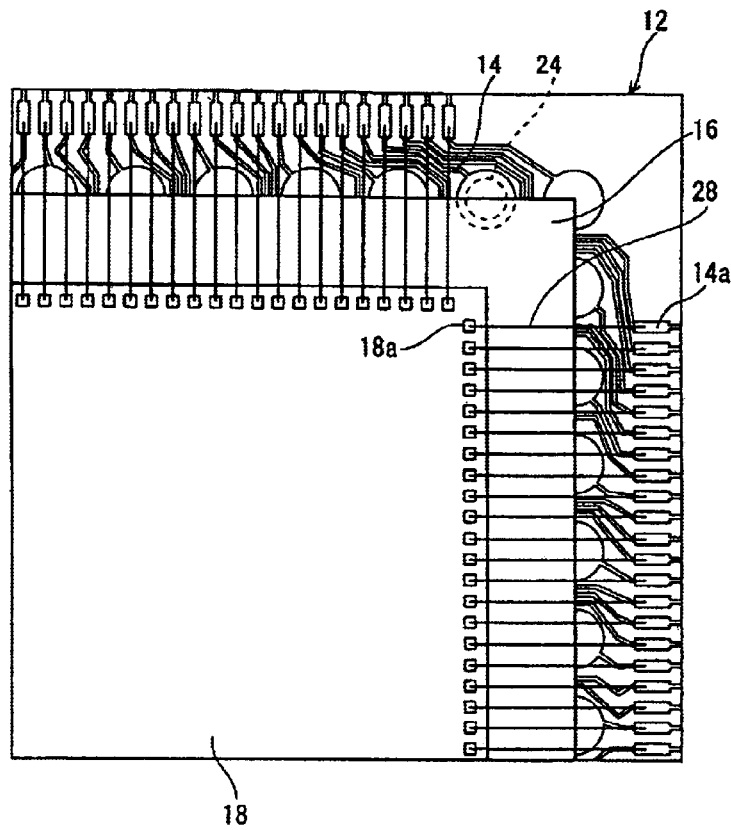
FIG. 2 is an illustrative view showing a positional relationship between wiring patterns and a resist.

A semiconductor device 10 of this embodiment shown in FIGS. 1 and 2 is formed with a resist 16 on wiring patterns 14 formed on a substrate 12, onto which a semiconductor chip 18 is die-bonded and then sealed or encapsulated by a mold 20, and is a so-called BGA (Ball Grid Array) type semiconductor device. It is noted that FIG. 1 simply shows a structure of the semiconductor device 10, and FIG. 2 shows in detail a positional relationship between the wiring patterns 14 and the resist 16 with respect to a quarter of the whole range.

The substrate 12 is formed with the plurality of wiring patterns 14 on the upper surface of a main body 22 which is formed of an insulative material such as a polyimide, a glass epoxy, a ceramic or the like, and a plurality (36 in this embodiment) of throughholes 24 are formed in a matrix fashion at a die-bonding area 12a of the substrate 12. It is noted that the "die-bonding area (12a)" means an area onto which a plurality of semiconductor chips 18 having different sizes are selectively die-bonded, and an area onto which the semiconductor chip 18 is actually die-bonded is called as a "chip area (12b)".

Each wiring pattern 14 is formed by an electrically conductive metal such as copper (Cu) and etc., and one ends of respective wiring patterns 14 are arranged so as to close upper ends of respective throughholes 24, and other ends of the wiring patterns 14 are arranged in an outer periphery portion of the substrate 12, and the other ends function as bonding pads 14a. Then, an Ni (nickel) plating and an Au (gold) plating are formed on the wiring patterns 14 (including the bonding pads 14a) arranged in the outer periphery portion of the substrate 12.

Herein, since the throughholes 24 are arranged in a matrix fashion (6 lines and 6 columns in this embodiment), it is impossible to make a direction to which respective one of the wiring patterns 14 extends from respective one of the throughholes 24 coincident with a direction that the throughholes 24 are arranged due to an obstruction of the adjacent throughholes 24. That is, the direction to which each of the wiring patterns 14 extends from each of the throughholes 24 is sure to form a predetermined angle with respect to the direction to which the throughholes 24 are aligned.

The resist 16 is for filling a space between an upper surface of the substrate 12 and a lower surface of a die-bonding sheet 26 (as described later) and is formed of a synthetic resin or the like in an approximately quadrangle shape in plane. Then, an upper surface of the resist 16 is formed in flat so as to mount thereon the semiconductor chip 18, and an outer peripheral edge line or an outside forming line (each side) of the resist 16 is arranged so as to pass over the throughholes 24 (the center in this embodiment) as shown in FIG. 2.

Then, the semiconductor chip 18 is die-bonded onto the upper surface of the resist 16 via a die-bonding sheet 26 as shown in FIG. 1(A). The die-bonding-sheet 26 is a well-known sheet type adhesive agent formed of a polyimide resin, an epoxy resin and etc., and an adhesive agent layer having an even thickness is formed by the die-bonding sheet 26.

Furthermore, electrodes 18a formed on an upper surface of the semiconductor chip 18 and the bonding pads 14a of the wiring patterns 14 are wire-bonded with each other by gold wires 28, respectively and the semiconductor chip 18, each gold wire 28 and etc. are sealed or encapsulated by a mold 20.

In addition, each of the throughhole 24 opened on the lower surface of the substrate 12 is mounted with an external terminal 30 of a ball shape, and the external terminals 30 and one ends of the wiring patterns 14 are electrically connected to each other, respectively.

Figure 3:
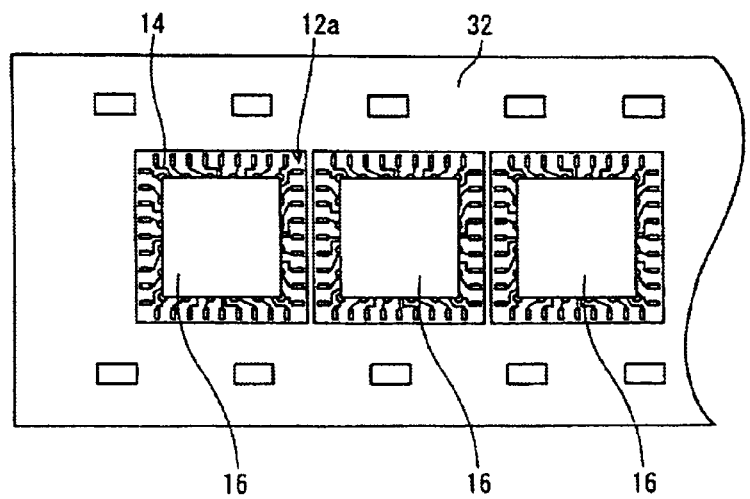
FIG. 3 is an illustrative view showing a method for manufacturing FIG. 1 embodiment.

In manufacturing the semiconductor device 10, a carrier film 32 having the wiring patterns 14 and the throughholes 24 (not shown) is prepared as shown in FIG. 3, and then, the resists 16 are formed on the die-bonding areas 12a of the carrier film 32 by a screen printing. Then, the Ni plating and the Au plating are performed on predetermined places of the wiring patterns 14 (bonding pad 14a and etc.).

Figure 8:
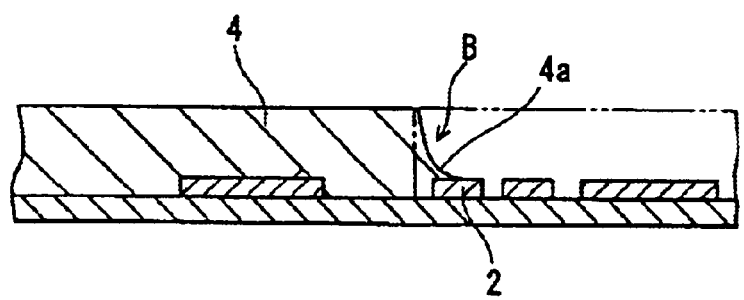
FIG. 8 is an illustrative view showing the prior art.

In performing the screen printing of the resist 16, although the periphery portion of the resist 16 flow-out into the outside of the resist 16 (FIG. 8), there is no place where the outside forming line or outer peripheral edge line of the resist 16 and the wiring pattern 14 are arranged to be close and in parallel to each other, and therefore, no resist thin film is formed in a long thin manner on the wiring patterns 14, and a plating film is never formed on that resist thin film.

After completion of the plating processing, as shown in FIG. 1(A), the semiconductor chip 18 is die-bonded onto the resist 16 by using the die-bonding sheet 26, and the electrodes 18a of the semiconductor chip 18 and the bonding pads 14a of the wiring patterns 14 are wire-bonded by utilizing the gold wires 28, respectively.

Successively, the carrier film 32 is housed in a metal mold, and a molding resin is injected into the metal mold. That is, the semiconductor chip 18a, the gold wires 28 and etc. are sealed or encapsulated by the mold 20.

When the mold 20 is hardened by cooling, the carrier film 32 is released from the metal mold, and the external terminals 30 are attached or mounted to the throughholes 24. Then, the semiconductor device 10 is obtained by dividedly cutting the carrier film 32.

According to this embodiment, because it is possible to prevent the plating film from being thinly formed on the resist 16 flowing-out onto the wiring patterns 14, it is possible to prevent the short-circuit of the wiring patterns 14 due to the expolation of the plating film.

Figure 4:
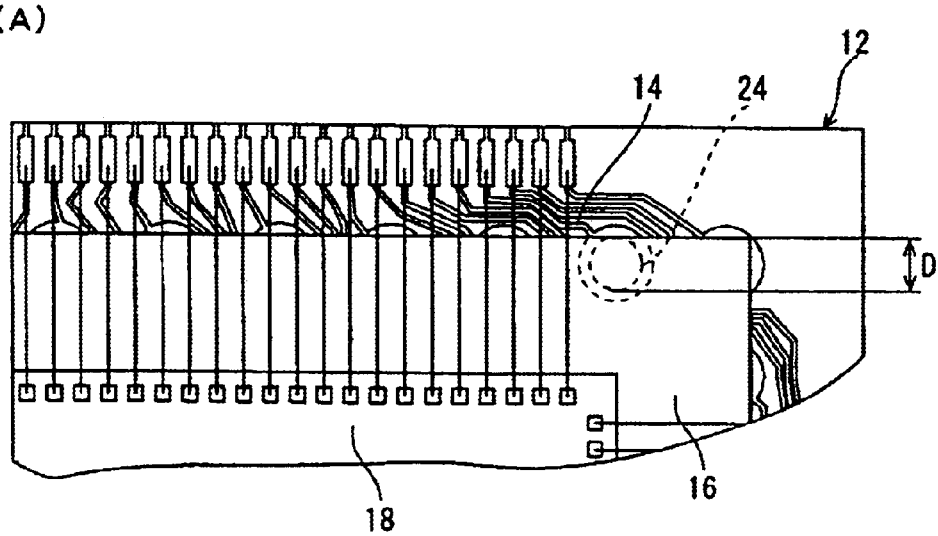
FIG. 4 is an illustrative view showing another embodiment of the present invention.
Figure 4:
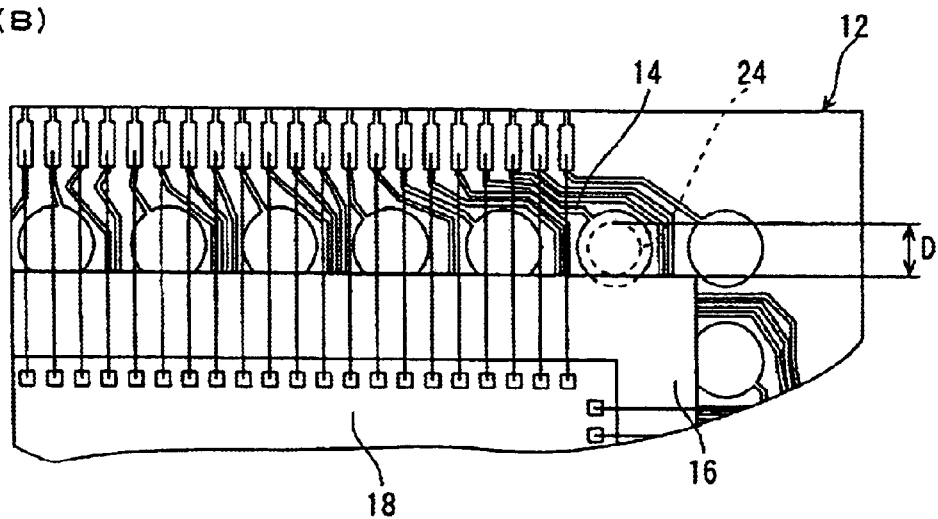

It is noted that although the outside forming line or outer peripheral edge line of the resist 16 is arranged on the center of the throughholes 24 in the above described embodiment, the outside forming line or outer peripheral edge line may be arranged at outermost parts of the throughholes 24 as shown in FIG. 4(A) and may be arranged at innermost parts of the throughholes 24 as shown in FIG. 4(B). That is, the outside forming line of the resist 16 may only be arranged within a range of a diameter D of the throughhole 24.

Figure 5:
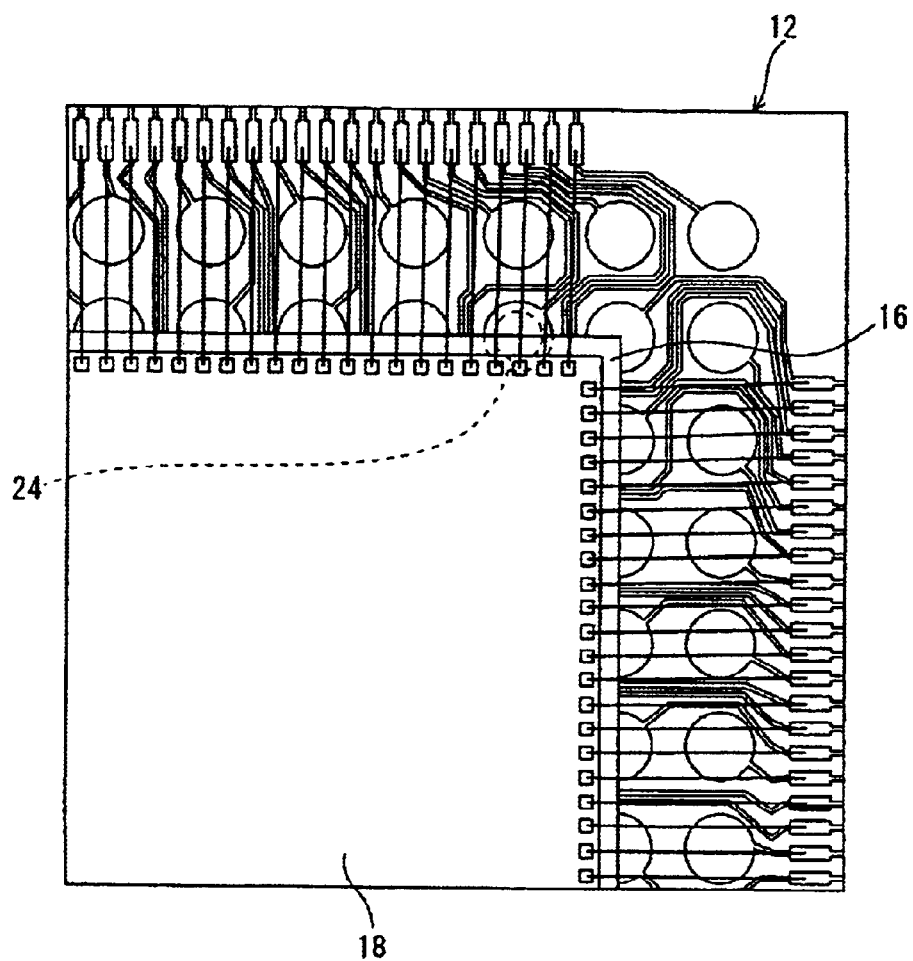
FIG. 5 is an illustrative view showing still another embodiment of the present invention.
Figure 6:
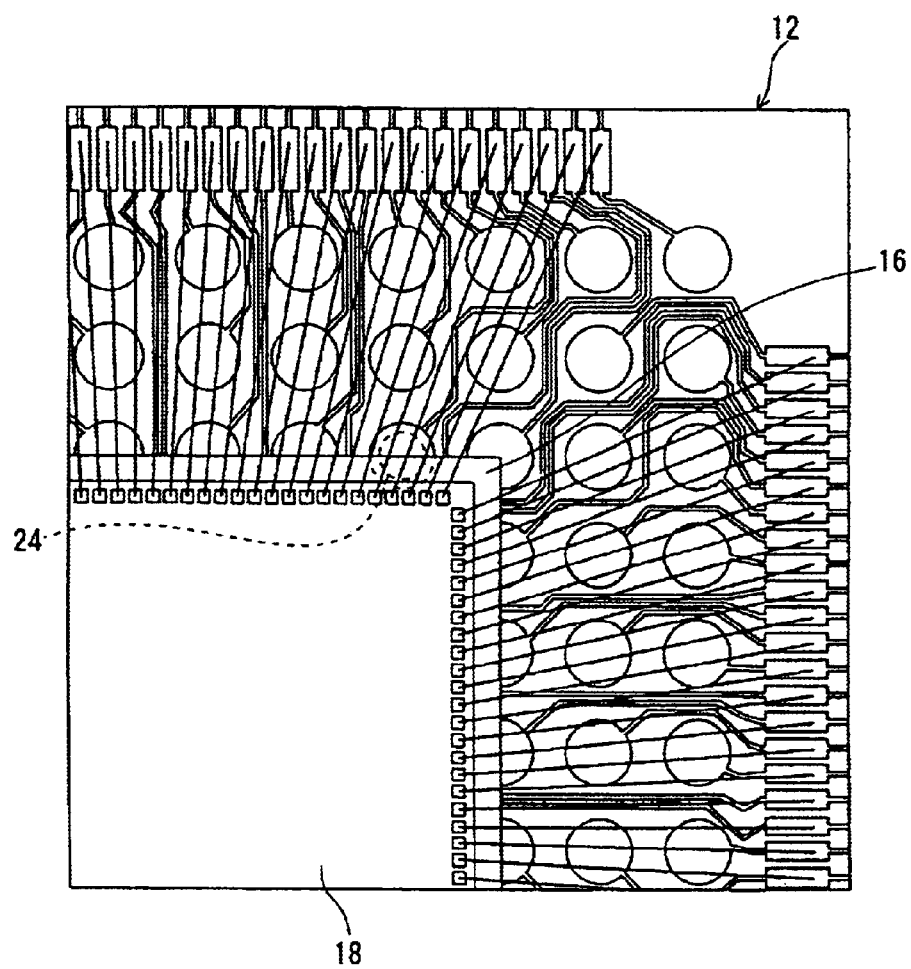
FIG. 6 is an illustrative view showing a further embodiment of the present invention.
Figure 7:
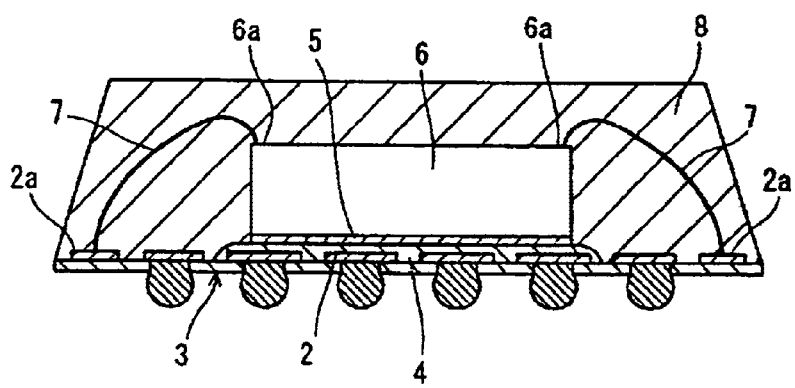
FIG. 7 is an illustrative view showing a prior art.
Figure 7:
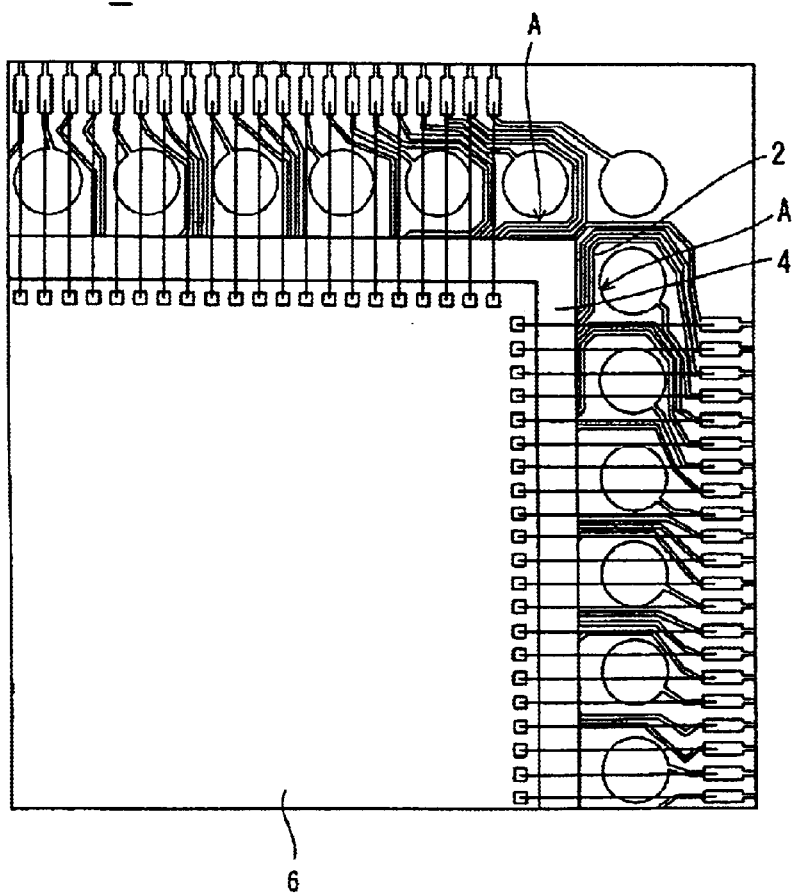

In the above-described embodiment, although the outside fanning line of the resist 16 is arranged on the outermost throughhole 24, the outside forming line may be arranged on the second throughhole 24 from the outside, for example, as shown in FIG. 5 and may be arranged on the third throughhole 24 from the outside, for example, as shown in FIG. 6. That is, as long as the condition that "the outside forming line or outer peripheral edge line of the resist 16 passes over the throughholes 24" is satisfied, a size of the resist 16 is properly changeable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a substrate formed with wiring patterns on its upper surface;
   a plurality of throughholes formed in a matrix fashion on said substrate;
   a resist formed on the surface of said substrate to prevent a portion of said wiring patterns from performing plating;
   a semiconductor chip die-bonded onto said resist;
   a mold encapsulating said semiconductor chip; and
   electrodes connected to one ends of said wiring patterns through said throughholes from a lower surface of said substrate, wherein
   an outer peripheral edge line of said resist passes only a portion of said throughholes.

2. A semiconductor device according to claim 1, wherein the outer peripheral edge line of said resist passes centers of said throughholes.

3. A semiconductor device according to claim 1, wherein there is no place where said outer peripheral edge of said resist and said wiring patterns are arranged to be close and in parallel to each other.

4. A semiconductor device according to claim 2, wherein there is no place where said outer peripheral edge of said resist and said wiring patterns are arranged to be close and in parallel to each other.

5. A semiconductor device according to claim 1, wherein at least a portion of said wiring patterns located outside of said outer peripheral edge line of said resist are plated.

6. A semiconductor device according to claim 2, wherein at least a portion of said wiring patterns located outside of said outer peripheral edge line of said resist are plated.

7. A semiconductor device according to claim 3, wherein at least a portion of said wiring patterns located outside of said outer peripheral edge line of said resist are plated.

8. A semiconductor device according to claim 4, wherein at least a portion of said wiring patterns located outside of said outer peripheral edge line of said resist are plated.

* * * * *